United States Patent [19]
Mourad

[11] Patent Number: 5,678,061
[45] Date of Patent: Oct. 14, 1997

[54] METHOD FOR EMPLOYING DOUBLY STRIPED MIRRORING OF DATA AND REASSIGNING DATA STREAMS SCHEDULED TO BE SUPPLIED BY FAILED DISK TO RESPECTIVE ONES OF REMAINING DISKS

[75] Inventor: Antoine N. Mourad, Aberdeen, N.J.

[73] Assignee: Lucent Technologies Inc., Murray Hill, N.J.

[21] Appl. No.: 504,096

[22] Filed: Jul. 19, 1995

[51] Int. Cl.⁶ .................................................. G06F 15/02
[52] U.S. Cl. ...................... 395/841; 395/182.04; 395/405
[58] Field of Search .......................... 395/182.04, 182.05, 395/441, 439, 489, 841, 405, 497.04, 800, 842, 182.03; 371/40.4

[56] References Cited

U.S. PATENT DOCUMENTS

| | | | |
|---|---|---|---|
| 4,688,168 | 8/1987 | Gudaitis et al. | 395/287 |
| 4,796,098 | 1/1989 | Giddings | 386/47 |
| 4,849,978 | 7/1989 | Dishon et al. | 395/182.04 |
| 5,088,081 | 2/1992 | Farr | 369/54 |
| 5,235,601 | 8/1993 | Stallmo et al. | 371/40.1 |
| 5,303,244 | 4/1994 | Watson | 395/182.03 |
| 5,404,454 | 4/1995 | Parks | 395/841 |
| 5,463,758 | 10/1995 | Ottesen | 395/441 |
| 5,471,640 | 11/1995 | McBride | 395/842 |
| 5,487,160 | 1/1996 | Bemis | 395/441 |
| 5,497,478 | 3/1996 | Murata | 395/484 |
| 5,499,337 | 3/1996 | Gordon | 395/182.04 |
| 5,519,435 | 5/1996 | Anderson | 395/441 |
| 5,519,844 | 5/1996 | Stallmo | 395/441 |

OTHER PUBLICATIONS

*Third Intl Workshop*, Nov. 1992, "The Design and Implementation of a Continuous Media Storage Server", P. Lougher et al, pp. 69–80.

*Proceedings of 26th Hawaii Intl Conf. on System Sciences*, v. 1, 1993 IEEE "Disk Subsystem Load Balancing: Disk Striping vs. Conventional Data Placement", G. R. Ganger et al, pp. 40–49.

"Performance Analysis of a Dual Striping Strategy for Replicated Disk Arrays", by Merchant et al, 1993, pp. 148–157.

"A Synchronous Disk Interleaving", by Kim et al, 1991 IEEE, pp. 801–810.

"Analytic Modeling and Comparisons of striping Strategies for Replicated Disk Arrays", by Merchant et al, IEEE 1995, pp. 419–433.

"Chained Declustering", by Hsiao et al, IEEE 1990, pp. 456–465.

"Tuning of Striping Units in Disk—Array—Based File System", by Weikum et al, IEEE 1992, pp. 80–87.

"An Approach to Cost—Effective Terabyte Memory Systems", by Katz et al, IEEE 1992, pp. 395–400.

"A Performance Study of Three High Availabilty Data Replication Strategies" by Hsiao et al, IEEE 1991, pp. 18–28.

"Replicated Data Management in the Gamma Database Machine", by Hsiao et al, 1990 IEEE, pp. 79–84.

"Introduction to Redundant Arrays of Inexpensive Disks (RAID)", by Patterson et al, IEEE 1989, pp. 112–117.

"Disk Subsystem Load Balancing", by Ganger et al, IEEE 1993, pp. 40–49.

(List continued on next page.)

*Primary Examiner*—Moustafa M. Meky
*Attorney, Agent, or Firm*—F. B. Luludis

[57] ABSTRACT

The reliability of supplying data stored in a plurality of different memories to different users is enhanced by (a) dividing each of the memories into primary and secondary sections, (b) partitioning the data into successive blocks and (c) storing the blocks of data in sequence in respective ones of the primary sections. Then storing in sequence the blocks of data that have been stored in the primary section of one of the memories in respective ones of the secondary sections of the other ones of said disks.

2 Claims, 8 Drawing Sheets

OTHER PUBLICATIONS

"Chained Declustering", by Golubchik et al, IEEE 1992, pp. 88–95.

"Systems Reliability and Availability Prediction", by Daya Perera, IEEE 1993, pp. 33–40.

"Communications—Intensive Workstations", by Katseff et al, IEEE 1992, pp. 24–28.

"LAN Lirchin", by Harbison, Robert, Feb. 1994, LAN Magazine, v9, n2, p. 93(14).

"Diamonds are Forever", by Radding, Alan, Midrance Systems, Feb. 9, 1993, v6, n3, p. 23(2).

FIG.3

| TIME | DATA BLOCK |
|---|---|
| D0 | t0−1 |
| D4 | t0+3 |
| D8 | t0+7 |
| D12 | t0+11 |
| D16 | t0+15 |
| D20 | t0+17 |
| D24 | t0+23 |
| ⋮ | ⋮ |
| Di | t0+k |

METHOD FOR EMPLOYING DOUBLY STRIPED MIRRORING OF DATA AND REASSIGNING DATA STREAMS SCHEDULED TO BE SUPPLIED BY FAILED DISK TO RESPECTIVE ONES OF REMAINING DISKS

FIELD OF THE INVENTION

The invention relates to striping (interleaving) data across multiple disks to improves concurrent access to the data by a plurality of different users.

BACKGROUND OF THE INVENTION

So-called disk striping (or interleaving) is used to provide increased bandwidth in the transmission of data by transferring data in parallel to or from multiple disks. Disk striping, or interleaving, more particularly, consists of combining the memory capacity of multiple disks and spreading the storage of data across the disks such that the first striping unit is on the first disk, the second striping unit is on the second disk, and the $N^{th}$ striping unit is on disk (N−1 mod M)+1, where M is the number of disks involved in the storage of the data.

Disk striping is particularly useful in storing video programs that will be used to implement video-on-demand (VOD) servers. Disk-based VOD servers use disk striping to ensure an acceptable level of concurrent access to each video program (object) stored in the server to ensure an acceptable level of access time to a stored video segment that is to be transmitted to a user/subscriber. Disk striping, however, makes a server (VOD system) more vulnerable to component (especially disk) failures, since a single component failure could cause an entire disk array (group) to become inoperable, thereby preventing users from having access to video programs stored on the disk array. The various hardware approaches taken thus far to deal with this problem have proved out to be costly, and handle only disk failures. Moreover, such approaches require additional data buffering in the server.

SUMMARY OF THE INVENTION

The foregoing problem is addressed and the relevant art is advanced by interleaving the content of data (e.g., a video program) across multiple storage disks using what I call a doubly-striped mirror arrangement, which allows a data system to use a large fraction of the available disk bandwidth in the server, as compared to prior mirrored approaches. Specifically, in accord with an aspect of the invention, a fraction, e.g., one-half, of each disk is used as primary storage while the remaining fraction is used as a backup storage, such that the data (e.g., the contents of a video program) is partitioned into data units which are striped across the primary storage area of a plurality of disks, e.g., N disks. When a "primary" copy of the content of the data has been so stored, then a backup copy is made such that the contents of each such primary storage area is striped across the backup storage area of the other disks.

The following detailed description and drawings identify other aspects of the invention.

BRIEF DESCRIPTION OF THE DRAWINGS

In the drawing:

FIG. 3 illustrates a schedule that a storage node of FIG. 1 may create for the unloading of data blocks stored in an associated disk;

DETAILED DESCRIPTION

The invention will be described in the context of a Video-On-Demand (VOD) system. It is to be understood, of course, that such a description should not be construed as a limitation, since it may be appreciated from the ensuing description that the claimed invention may be readily used in other data applications, i.e., an information delivery system of a generalized form.

Figure 1:
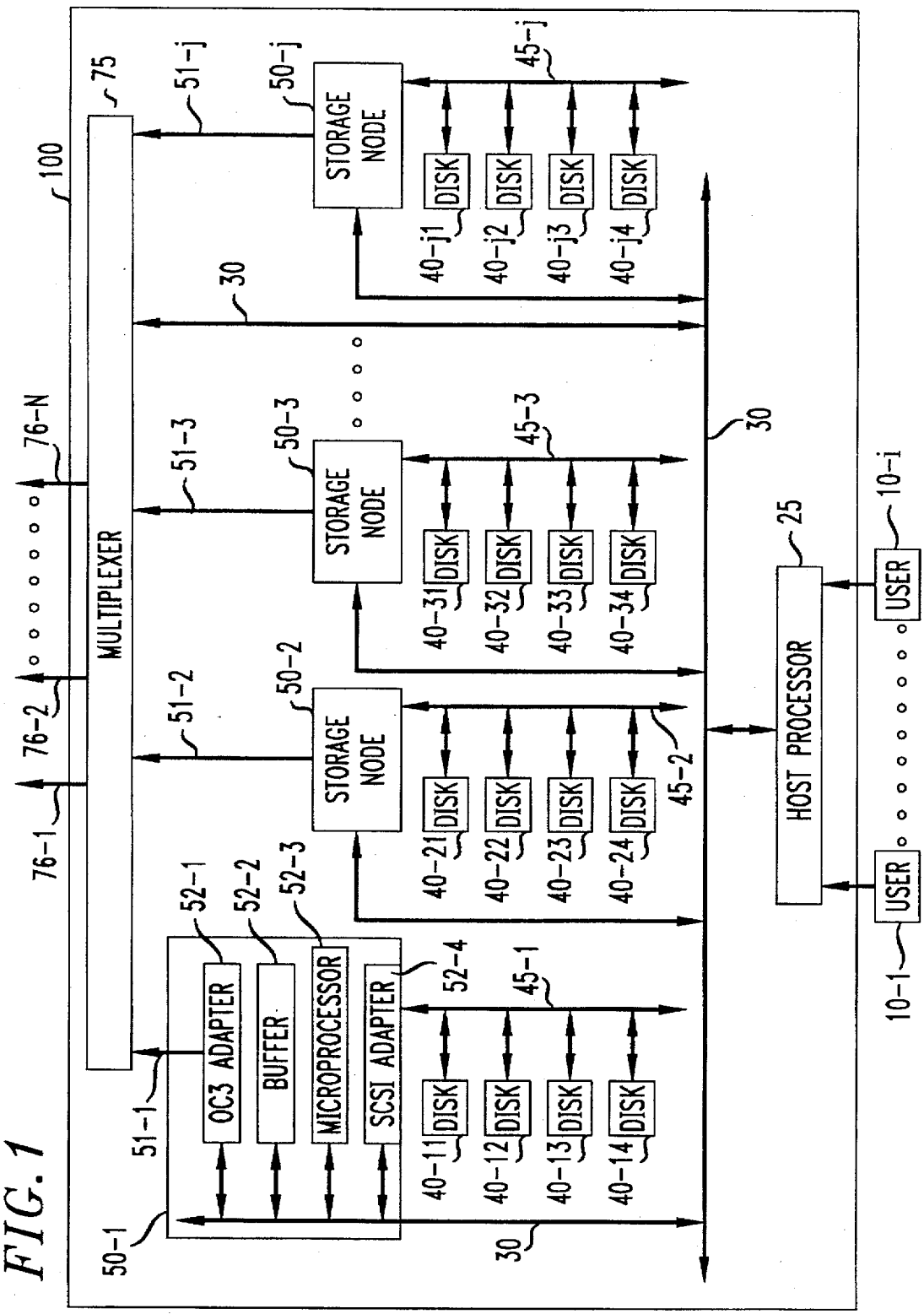
FIG. 1 is a broad block diagram of a data server in which the principles of the invention may be practiced.

With that in mind, in an illustrative embodiment of the invention, multiplexer 75, FIG. 1, which may be, for example, an Asynchronous Transport Mode switch, receives data in the form of packets from storage nodes 50-1 through 50-N, respectively. Multiplexer 75 then routes the received packets over respective virtual circuit connections via communications paths 75-1 through 75-N to their intended destinations, in which a packet may carry a segment of a video program and in which the content of the video program may be doubly striped and mirrored in accord with the invention across storage disks 40-11 through 40-j4, as will be explained below in detail. Because of such striping, a storage node 50$i$ may supply a packet carrying a respective portion of a segment of a particular video program to multiplexer 75 via a virtual channel assigned to the segments that are stored in storage disks 40$k$ associated with storage node 50$i$ and that are to be delivered to the same destination (subscriber), where N, j, i and k>1. Thus, segments of the content of a video program striped across the storage disks may be supplied to multiplexer 75 via respective ones of a number of different virtual data channels assigned for that purpose. Once such contents have been so delivered, then the assigned virtual data channels may be reassigned for some other but similar purpose (or left idle).

It is seen from FIG. 1, that server 100 includes host processor 25 which interfaces a user with server 100 for the purpose of processing an order (request) received from a user, e.g., one of the users 10-1 through 10-$i$, in which the request may pertain to a particular video program (such as a movie). The requested program may be one that has been segmented and striped across disks 40-11 through 40-j4, which segments are then unloaded in sequence and transmitted (routed) to the user via multiplexer 75 and the appropriate one of the communications paths 76-1 through 76-N. The request, on the other hand, may be directed to the stopping, restarting, etc., of the video program.

Processor 25, more particularly, first determines if it has the resources available to service the request. That is, if a disk is able to support n data streams and the content of a program is striped over N disks, then nN streams (users) can be supported from the array of N disks, where n and N>1. Thus, server 100 may service the user's request if the current number of data streams that are being supplied by the array of disks 40-11 through 40-j4 to multiplexer 75 is less than nd. Assuming that is the case, then processor 25 communicates with multiplexer 75 to obtain channel assignments that the storage nodes may use to sequentially transmit their respective video segments that form the requested video to multiplexer 75. Included in such communication is a request to establish a virtual connection between each of the assigned channels and a channel of one of the communications paths 76-1 through 76-N that will be used to route the program to the user. In addition, processor 25 establishes a schedule that the storage nodes 50i are to follow in the delivery of the segments to the user via multiplexer 75. Processor 25 then supplies the assigned channels and schedule to each of the storage nodes 50i via Local Area Network (LAN) 30, as discussed below. The schedule includes the identity of the storage node, e.g., 50-1, and associated disk, e.g., disk 40-11, storing the initial (first) segment of the requested program. The schedule also includes the time of day that the first segment of the program is to be unloaded from disk and supplied to multiplexer 75. Processor 25 then forms a message containing, inter alia, the (a) schedule established for running the program, (b) identity of the program, (c) identity of the storage node containing the first segment of the program, (d) channel that has been assigned to the node whose address is contained in the header of the message, and (e) time of day that the first segment is to be transmitted to the user. Processor 25 then sends the message to the storage node identified in the message via LAN 30. Processor 25 then updates the message so that it is applicable to a next one of the storage nodes and sends the message to that node via LAN 30. In an illustrative embodiment of the invention, processor 25 sends the message first to the storage node 50i containing the first segment of the requested program. Processor 25 sequentially sends the message to the remaining storage nodes based on the order of their respective addresses and updates the message following each such transmission.

Since the storage nodes 50i are similar to one another, a discussion of one such node equally pertains to the other storage nodes. It is thus seen that storage node 50-1, FIG. 1, includes microprocessor 52-3 for communicating with host 25, in which the communications are typically directed to setting up a schedule for the delivery of respective video segments stored in buffer 52-2 to multiplexer 75 via the assigned data channel and for controlling the storing and unloading of the segments from buffer 52-2. Buffer 52-2 represents a dual buffer arrangement in which microprocessor 52-3 unloads segments of video from respective ones of the disks 40-11 through 40-14 and stores the unloaded segments in a first one of the dual buffers 52-2 during a first cycle. During that same cycle, e.g., a time period of one second, microprocessor 52-3 in turn unloads portions of respective segments of respective videos stored in the second one of the dual buffers 52-2 during a previous cycle. Adapter 52-1 reads a packet from the buffer and transmits the packet to multiplexer 75 via communication path 51-1 (which may be, e.g., optical fiber) and the channel assigned for that particular purpose. OC3 adapter 52-1 implements the well-known OC3 protocol for interfacing a data terminal, e.g., storage node 50-1, with an optical fiber communications path, e.g., path 51-1. SCSI adapter 52-4, on the other hand, implements a Small Computer System Interface between microprocessor 52-3 and its associated disks 40-11 through 40-14 via bus 45-1.

Microprocessor 52-3 repeats the foregoing process during a next cycle, at which time the first buffer is being unloaded and the second buffer is being loaded with video segments obtained from disks 40-11 through 40-14, and so on.

As mentioned above, a video program is doubly striped and mirrored across disks 40-1 through 40-j4. Specifically, in accord with an aspect of the invention, the striping of a video is confined to a predefined portion of each such disk, i.e., a primary section of a disk, and a backup copy of a disk is then made by striping the contents of the disk across another predefined portion, i.e., a secondary section, of each of the other disks. To say it another way, the contents of a video program are striped across N disks by dividing the program into consecutive blocks, D0 through Da, of fixed size U, e.g., three megabits, and striping the blocks across the primary sections of the disks in round-robin order. The contents of each disk are then striped across the secondary sections of the other disks to create a backup copy of such contents. An example of the inventive striping is shown in FIG. 2

Figure 2:
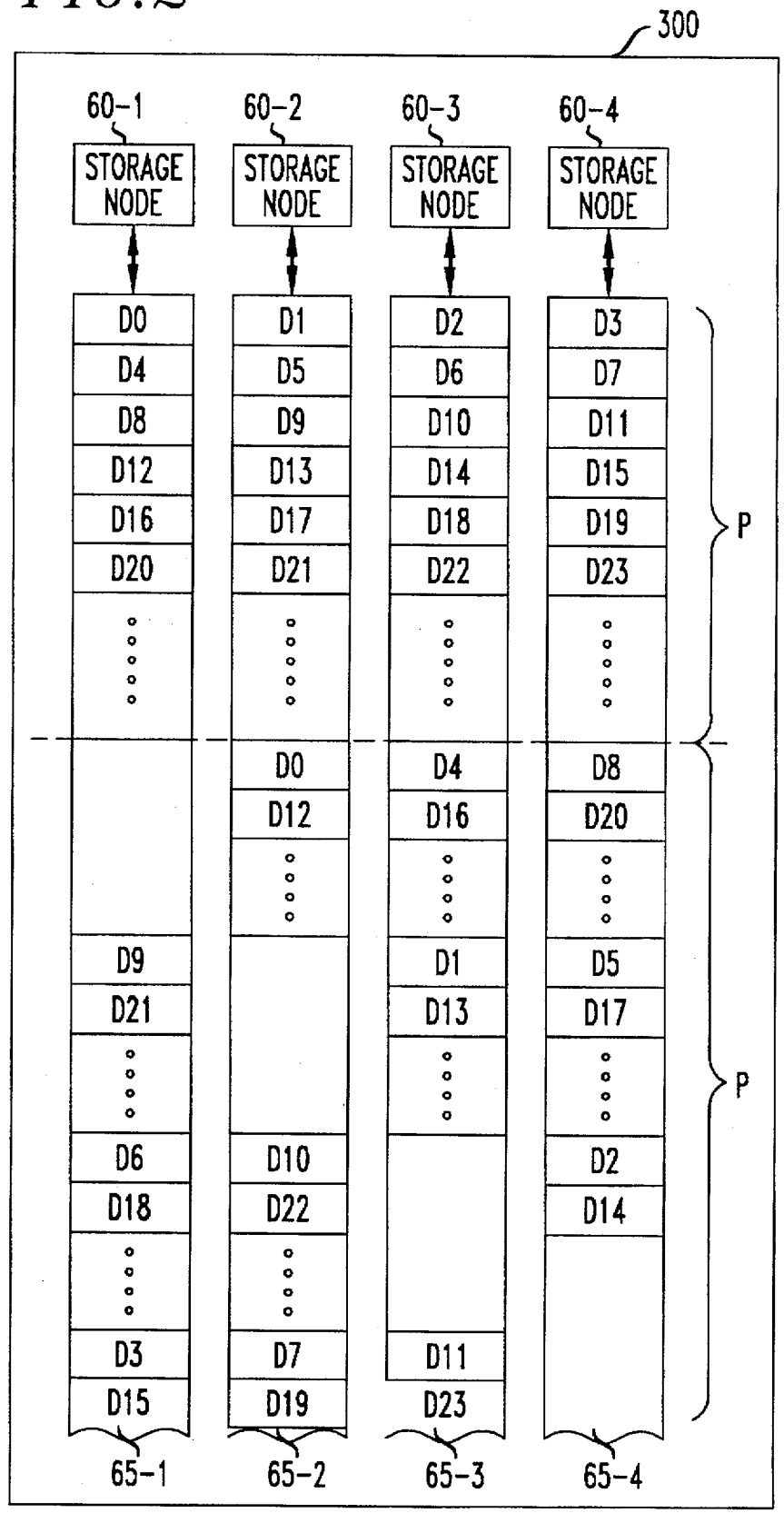
FIG. 2 is an illustrative example of the way in which data may be striped across a plurality of disks in accord with an aspect of the invention.

For the sake of simplicity and clarity, only disks 65-1 through 65-4 of a server 60, FIG. 2, are shown. (The other elements of the server 60, e.g., storage node, host processor, etc., are not shown.) Assume that the host processor has divided a video program into a plurality of sequential data blocks (segments) D0 through Di for storage in the disks, in accord with the invention. To do so, the host processor stores the data blocks D0 through Di in sequential order (i.e., round-robin order) in the primary sections P of disks 65-1 through 65-4, respectively, as shown in FIG. 2. That is, the host processor stripes the data blocks across the primary sections of disks 65-1 through 65-4. The host processor then makes a backup copy of the contents of the primary sections of the disks 65i, for example, 65-1. It does this, in accord with an aspect of the invention, by striping the data blocks forming such contents across the secondary sections of the other disks, i.e., disks 65-2 through 65-4, in round-robin order. For example, it is seen from FIG. 2 that the first three data blocks D0, D4 and D8 stored in disk 65-1 are also stored in the secondary (backup) sections S of disks 65-2 through 65-4, respectively. This is also the case for data blocks D12, D16 and D20 as well as the remaining contents of the primary section of disk 65-1. Similarly, the contents of the primary section of disk 65-2 are striped across disks 65-3, 65-4 and 65-1 in that order. For example, it is also seen from FIG. 2 that data blocks D1, D5 and D9 of the primary section of disk 65-2 are striped across disks 65-3, 65-4 and 65-1, respectively, and so on. Such backup striping is shown for the contents of the primary sections of disks 65-3 and 65-4.

The unloading of the data that forms a video program is done, for example, sequentially, e.g., D0 to D3, then D4 to D7, and so on. It is understood, of course, that the start of a video program does not have to begin from the first disk, e.g., disk 65-1, but may start with any one of the disks, since the starting point may be mapped to any one of the disks. However, for the sake of simplicity, it is assumed herein that the program starts at disk 65-1 with block D0. As mentioned above, the unloading of data blocks (segments) from the disks and storage thereof is done cyclically, such that an unloaded block of data is stored in a first buffer during a first cycle and the next block is unloaded during the next cycle and stored in a second buffer while the first block from the first buffer is being transmitted to the user.

Assume at this point that the host processor has received a request for the video program from a user and the host has communicated that request to each of the storage nodes 60-1 through 60-4 with the indication that the start of the program block D0 is to be delivered at time t0. Further assume that a cycle is one second and a block of data is three (3) megabits. Upon receipt of the request, node 60-1 generates a schedule for the unloading of the blocks of the program that are stored in associated disk 65-1 and stores the schedule in internal memory (not shown). The schedule so generated starts with the unloading of block D0 at time t0 minus 1 second for delivery to the associated server 300 multiplexer at time t0. The next entry, D4 is scheduled to be unloaded at time t0 plus 3 seconds for delivery at t0 plus 4 seconds. The next entry D8 is scheduled to be unloaded at time t0 plus 7 seconds for delivery at t0 plus 8 seconds, and so on. An illustrative example of such a schedule is shown in FIG. 3.

Storage node 60-2 generates a similar schedule with respect to data blocks D1, D5, D9, etc. That is, a storage node is programmed so that it determines its order in delivering the sequence of data blocks 35 forming the requested program to the associated multiplexer as a function of the identity of the node 60$i$ having the first block of such data. Accordingly, the schedule that node 60-2 generates will indicate that data block D1, D5, D9, etc., are to be respectively delivered during cycles t0+1, t0+5, t0+9, and so on. Similarly, storage nodes 60-3 and 60-4 generate their own delivery schedules with respect to the data blocks of the requested program that are stored in their associated disks.

Further, a number of users may request the same program. For example, a first data stream composed sequentially of data blocks D0, D1, D2, D3, ... D8, etc., may be unloaded in that order during respective cycles to respond to a request entered by one user and that concurrently therewith data blocks D13, D14, D15, etc., may be unloaded in that order during the same respective cycles to respond to a request entered earlier by another user. Still further, a third user may be accessing another data stream involving blocks D29 etc. This can occur, for example, if the second user started accessing the performance at an earlier time and has already passed through the sequence of blocks D0 to D12 and the third user has already passed through the sequence of D0 to D28, and so on.

Figure 4:
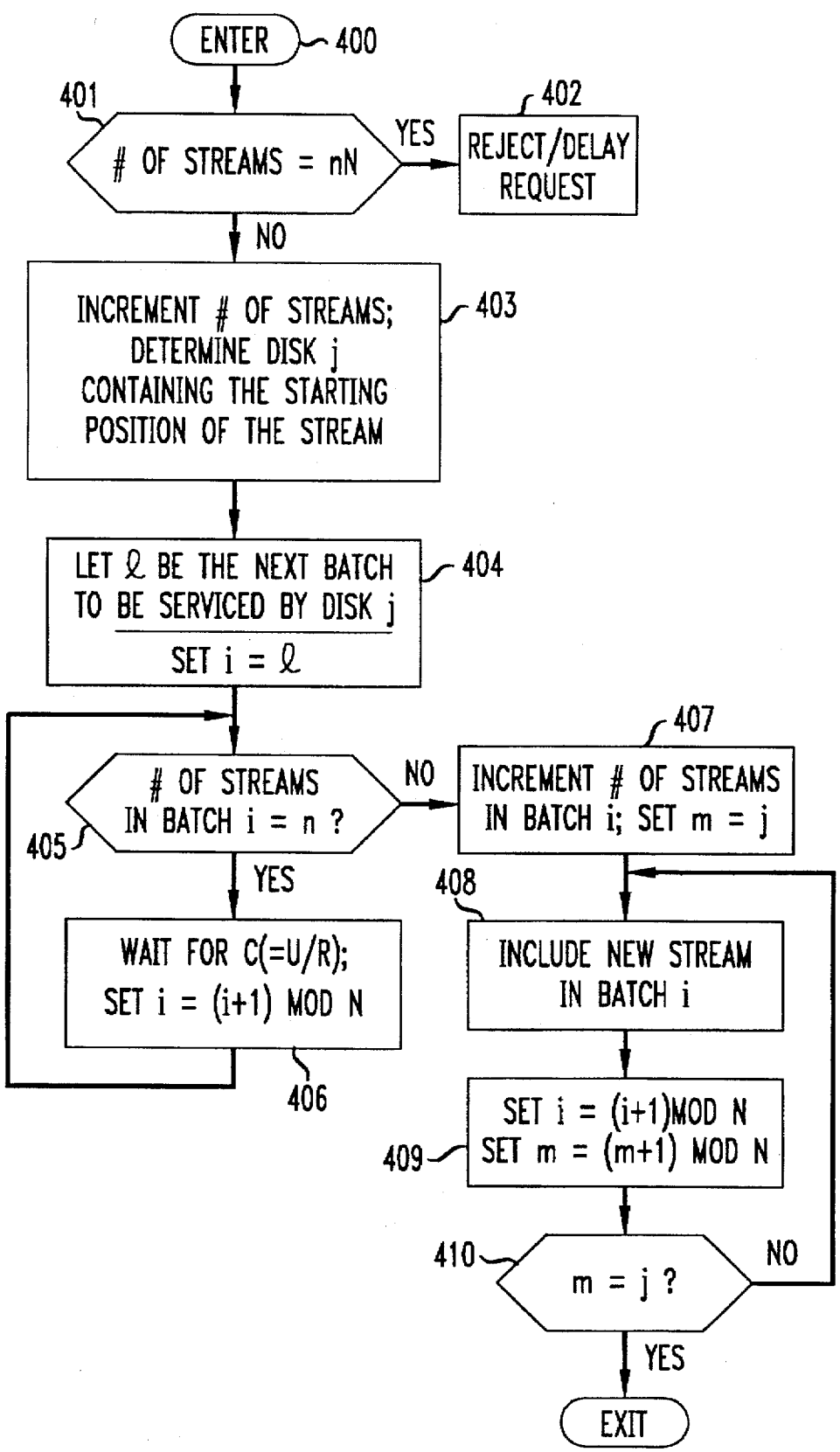
FIG. 4 is a flow chart of the program that the host processor of FIG. 1 invokes to create a schedule to supply the data blocks on the disks of FIG. 1 to a user.

A new video performance may start if the number of video streams currently being served is less than nN. When a new video performance is initiated, the disk containing the starting address for the requested stream is identified. However, the first I/O request for that session cannot be initiated until the beginning of a cycle in which the disk services less than n sessions. Hence there might be a time delay of up to NC before an I/O request for that session is queued. Playback starts at the end of the cycle in which the first I/O has been requested. Hence, the upper bound on the playback delay is (N+1)C. FIG. 4 illustrates in flow chart form the program that is implemented in processor 25 to process a user request to view a video program or to restart an interrupted stream.

In FIG. 4, the operation starts at step 400 in response to receipt of a request for a new stream or to restart a previously stopped stream. Specifically, responsive to such a request, the program is entered at block 400 where it proceeds to block 401 to check to see if the number of data streams (i.e., the number of users) that are actively being served equal nN, where n and hl are defined above. If that is the case, then the program proceeds to block 402 where it delays the processing of the user's request until system capacity becomes available. Otherwise, the program proceeds to block 403 where it increments the number of data streams (users) that are being processed and then determines the starting point (address) of the first data block of the requested video program (or the address of the restart data block), in which the address includes the address of the corresponding disk j. The program (block 404) then sets a variable i to correspond to the next batch of data streams that will be processed using disk j. The program (block 405) then checks to see if the number of data streams in batch i equal the maximum n. If so, then the program (block 406) initiates a wait of a duration equal to C(U/R) and sets i to the address of the next batch and returns to block 115 to determine if the request can be added to that batch.

If the program exits block 405 via the 'no' path, then it increments (block 407) the number of data streams in batch i and sets a variable m to the address of node j. The program then assigns the user's request to batch i for transmission via bus m and the appropriate storage node 50$m$. The program (block 409) then sets C=(i+1)mod N and sets m=(m+1) mod N. The program (block 410) then determines if m=j and exits if that is the case. Otherwise, the program returns to block 408.

It can be appreciated that a disk may fail during the playing of a video program. As mentioned above, a disk failure is readily handled in accordance with an aspect of the invention, by striping the contents of a disk across the secondary storage areas of the other disks, as mentioned above. One aspect of the claimed invention then is to ensure that, following a disk failure, the processing load being handled by a failed disk is assumed equally by the operable (surviving) disks. Accordingly, a scheduling algorithm described below ensures that the "video streams" that were being provided by the failed disk(s) may be serviced seamlessly from the surviving disks. This may be achieved by reserving about 1/Nth of the I/O bandwidth of each disk system so that video streams may be reassigned thereto to handle the load of the failed disk.

Hence, under normal operation, about (1−1/N)th of the available disk bandwidth may be fully used to serve video streams. Accordingly, a N-disk subsystem may support N (n−[n/N]) streams. The quantity [M/N] designates the smallest integer larger than or equal to n/N. For example, if N=10 and n=8, then 88% of the disk I/O bandwidth may be exploited.

Figure 5:
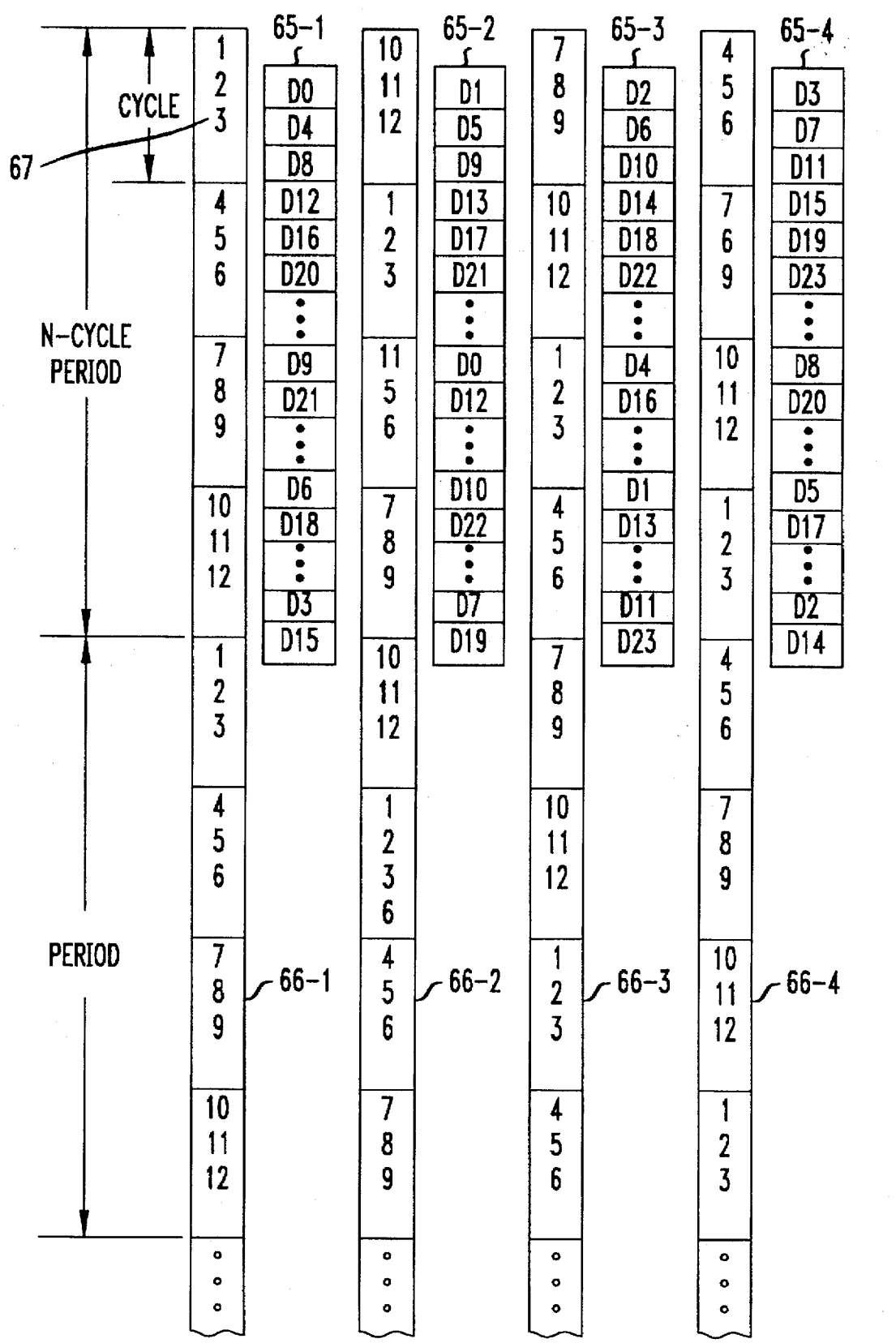
FIG. 5 is an example of a schedule for a system having four disks and three data streams per cycle.

It is clear from the foregoing that when a disk (or disk system) fails, the processing load (schedule) being handled thereby needs to be re-assigned to the disks that have not failed. Specifically, the schedule for a given disk is a periodic schedule that repeats every Nth cycle, in which a disk may provide up to n−[n/N]streams each cycle. A different set of video (or data) streams is launched in each of the N cycles in a periodic schedule. FIG. 5 illustrates a sample schedule where N=4 and n=4. The first cycle in each column 66$i$ shows the schedule for disk 65$i$ under normal operation. Assume that disk 65-1 fails at the end of cycle 67. Upon detection of the failure, the provision of the data streams that disk 65-1 provides are reassigned to the operable disks 65-2 through 65-4 on a cycle by cycle basis. The reassignment is completed once for all N cycles in a system period. That is, for each cycle, the video streams provided by the failed disk are inserted in the schedules of the surviving disks in the same cycle.

Such video streams may be reassigned in round-robin order so that the additional load is shared equally among the disks. In such an instance, each surviving disk will be assigned (n−[n/N])/(N−1) additional video streams and will provide up to n−[n/N]+(n−[n/N])/(N−1) (≤n) streams in one cycle.

Data streams from the other N−1 cycles in the N-cycle period are assigned in a similar fashion. For the next N-cycle period, the reassigned schedule of the failed disk is shifted to the right by one such that a given video stream on the failed disk is reassigned to disk i in one period, and is reassigned to disk (i+1) mod (N−1) in the next period. This result occurs because the backup data for the particular video stream (data blocks) on the failed disk are striped across the backup sections of the other disks. Hence, the new schedule that results from reassigning the video streams is also a periodic schedule equal to N(N−1)C, where C is the cycle time.

Figure 6:
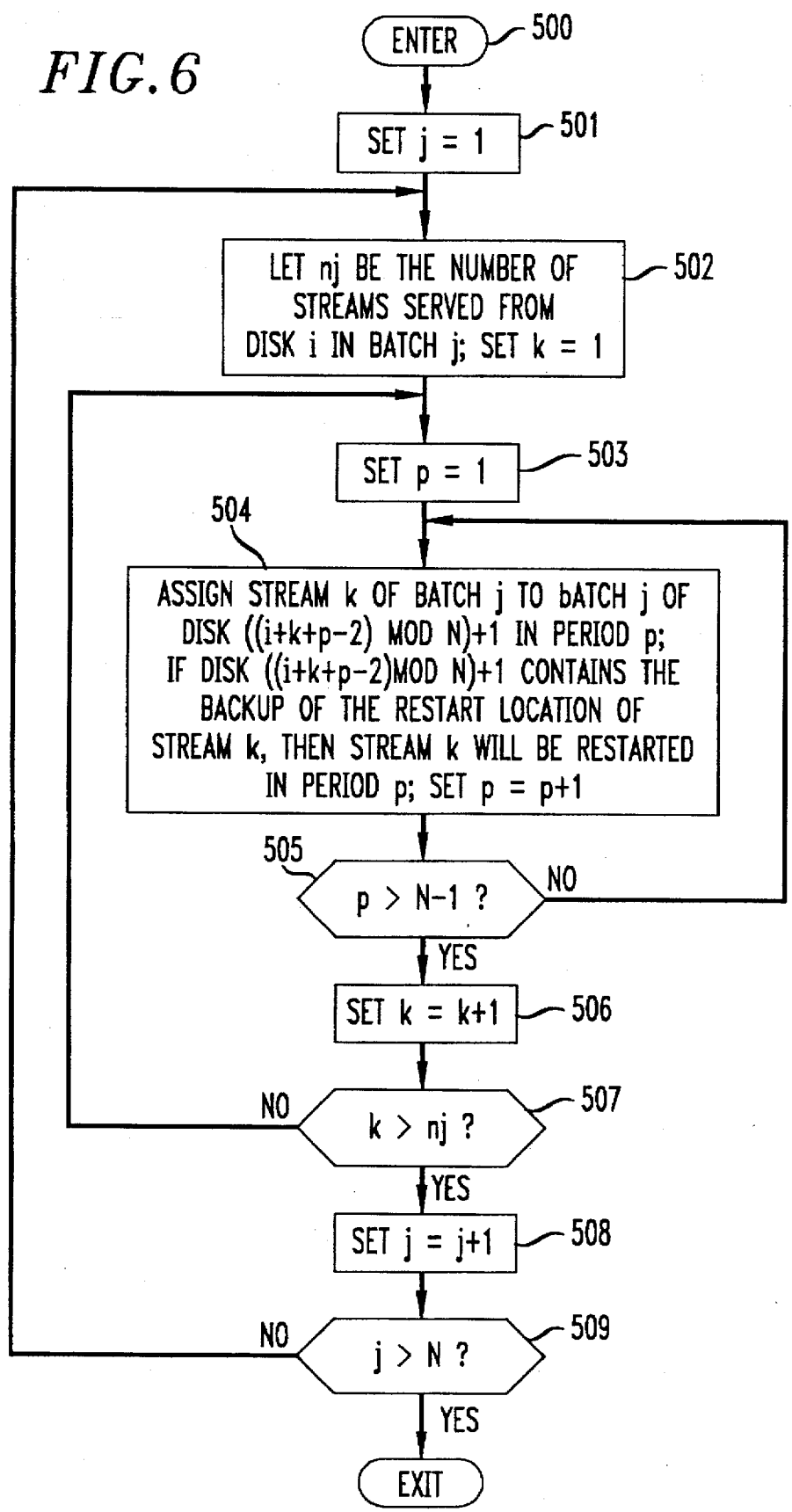
FIG. 6 is a flow chart of the program that the host processor of FIG. 1 uses to reschedule the provisioning of data blocks that were to be supplied by a disk that failed.

The processor 25 program that implements such scheduling is illustrated in FIG. 6. Specifically, when the program (block 500) is entered it sets (block 501) variable j representing the address of the first batch of data streams that the program will process to a value of 1. Assume that the number of batches that will be processed is equal to N. Using that number the program (block 502) sets the number of data streams in batch j that is provided by disk i to nj and sets k to equal 1, in which k represents a particular data stream in the batch—initially the first data stream. The program (block 503) then sets a variable p representing the address of a respective system period (frame) to a one. Initially, the program at block 504 assigns the first data stream to the first batch of data streams to be processed, in the first period following the disk failure, by the disk identified by ((i+k+p−2)modN)+1. If that disk contains the backup data block that will be used to restart the first data stream, then that data block will be restarted in period p, initially the first period. Following the foregoing, the program increments p and checks to see (block 505) if the value of p exceeds the total number of disks (less the failed disk). If not, then the program returns to the beginning of block 504. Otherwise, the program (block 506) increments k and checks (block 507) to see if the new value of k exceeds the number of data streams that were served by the failed disk in batch j. If not, then the program returns to block 503 to continue the rescheduling process for the new value of k. Otherwise, the program (block 508) increments the value of j to identify the next batch of data streams that the program will process and then checks (block 509) to see if it is done, i.e., that the value of j is greater than the number of batches N. If that is the case, then the program exits. Otherwise, it returns to block 502 to continue the rescheduling process.

Figure 7:
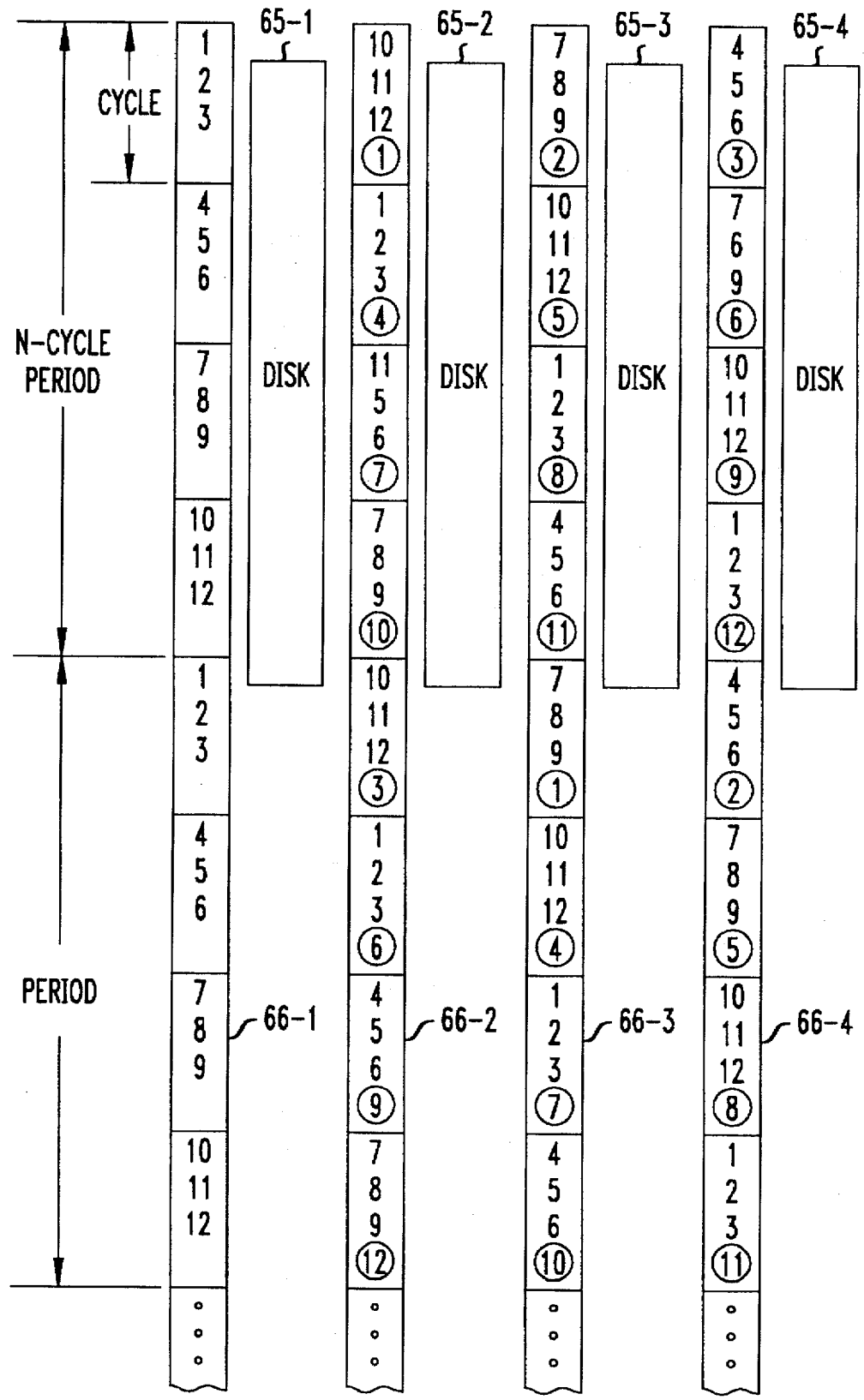
FIG. 7 is an illustrative example of the result generated by the program of FIG. 6.

FIG. 7 illustrates an example of such rescheduling and assumes that disk 65-1 has failed. It is seen from the FIG. that the rescheduling procedure causes the provisioning of data streams 1 through 12 provided by failed disk 65-1 to be shared among the remaining disks 65-2 through 65-4, in the manner discussed above.

As mentioned above, the aforementioned rescheduling process may cause a slight disruption in service. This occurs as a result of not being able to restart a data stream immediately because the disk it is being reassigned to may not contain in the associated backup the data block to restart (continue) the program at the point of failure. Hence, the particular request being serviced may be delayed for a number of N-cycle periods until the program is rescheduled on the disk containing the desired data block. A worst case delay would be equal to N−1 periods or N(N−1)C, where N and C respectively equal the number of disks in the system (or in a striping group) and the length of the cycle time to schedule concurrent requests from the disk. To reduce the delay, the location where the data stream is to be restarted may be used in the reassignment algorithm. Specifically, when assigning streams from a given cycle of the failed disk schedule, assign as many streams as possible to disks containing their restart location with the constraint that no more than [n/N] additional streams are assigned to any given disk, where n is the maximum number of streams in a batch or the maximum number of streams served concurrently by a disk in one cycle. An attempt is then made to assign those data streams that could not be assigned during the first pass to disks disposed one position to the left of the disk containing the restart location. This procedure guarantees that the data stream may be restarted in the next N-cycle period. Up to N−1 such passes may be necessary to reassign all of the data streams. The foregoing procedure thus attempts to assign the data stream to the disk nearest and to the left of the one holding its restart data block.

Figure 8:
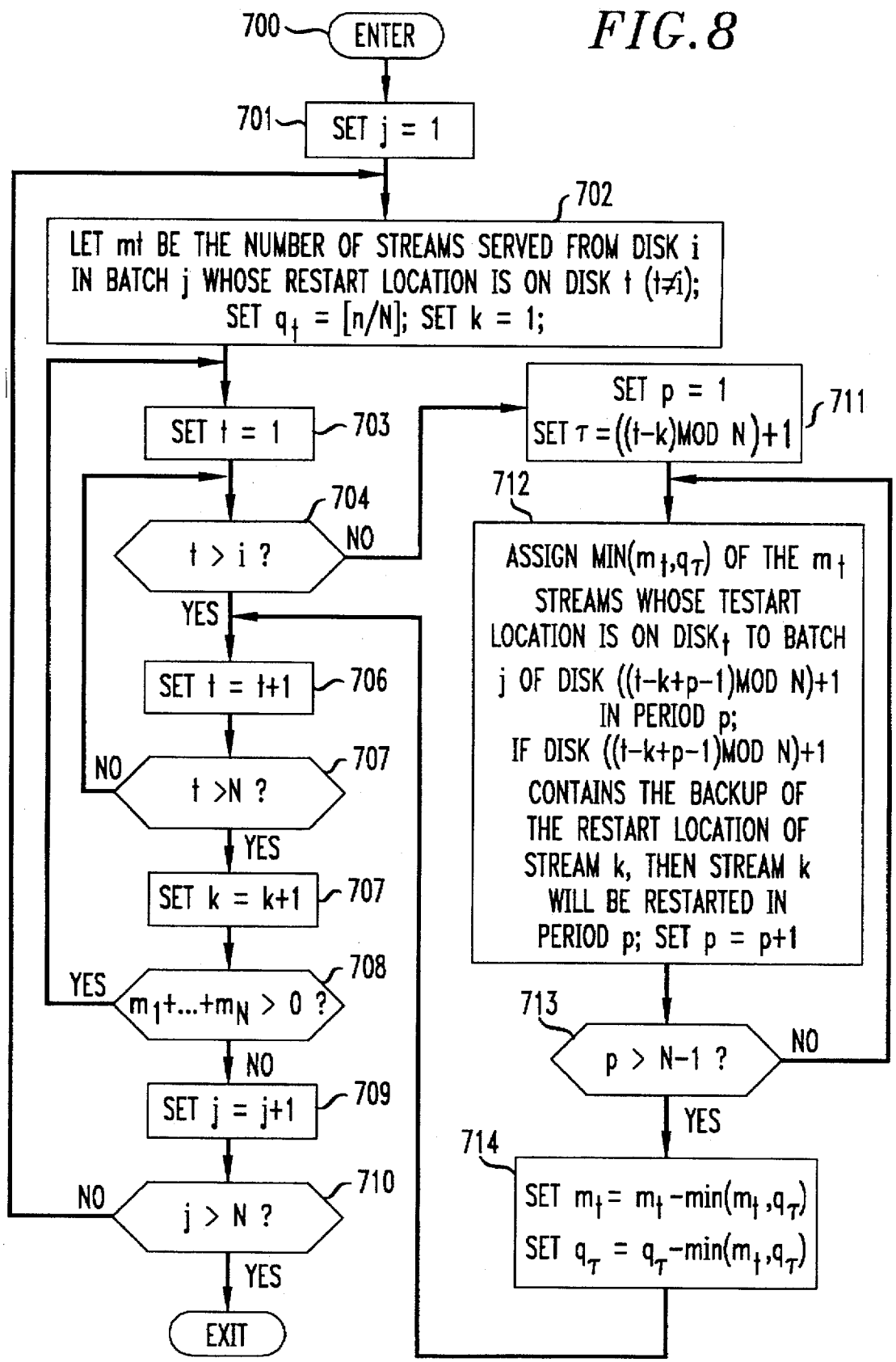
FIG. 8 illustrates an alternative to the program of FIG. 6.

FIG. 8 illustrates the program which implements the improved rescheduling scheme in processor 25. Specifically, when entered as result of a disk failure, the program proceeds to block 701 where it sets variable j representing the batch of data streams that need to be rescheduled to a value of one (i.e., the first batch, where the first batch would be, e.g., data streams 1, 2 and 3 illustrated in column 66-1 of FIG. 8. The program (block 702) then sets variable $m_t$ to equal the number of data streams forming batch j and supplied by the failed disk i, in which the restart data blocks for the latter data streams are on the backup of disk t, and in which disk t is other than disk i. The program then sets a variable $q_t$ to equal the capacity available on disk, to accommodate additional data streams. In an illustrative embodiment of the invention, a capacity of $1/N^{th}$ is reserved to handle the additional data streams that were to be served by a failed disk, where n is the maximum number of users that may be supplied from a disk and N is the number of disks contained in the server system. The program then sets a variable k that tracks the number of "stages" (or passes) that are used by the program to assign data streams. In stage one, the program tries to assign the streams directly to the disks that contain the restart data blocks in their backup sections. The program then tries to assign data streams that were not assigned during stage one.

The program (block 703) then starts the rescheduling process by setting 't' to equal a value of one and then checks (block 704) to see if the current value of t equals i (i.e., the number of the failed disk). If yes, then the program (block 705) increments t. If t is found not to be greater than the value of N (block 706) then the program returns to block 704. This time, the program will take the no leg from block 704 to block 711 where it sets the variable p to a value of one, thereby defining a first period of cycles following the failure of disk i. Note that before the disk failure, there were N batches in a repeating period. Following the failure, there will be N−1 periods each containing N batches or cycles. The (N−1) periods are repeated and form a new periodic schedule.

The program (block 712) then assigns the min of m, and q, of the m, data streams whose respective restart data blocks are stored in the backup section of disk, to batch j of the disk containing the restart data blocks in its backup section for the first period. (It is noted that the first expression in block 712 equates to disk t for p=1 and k=1.) The program then sets the restart schedule for the assigned block(s). That is, if the disk contains the restart data block, then the program schedules the data stream for restart in the current period p, which is true of the data streams that are assigned during the first stage (pass) of rescheduling process. The program then goes on to complete the scheduling. That is, assigning a data stream to one disk for one period may not be sufficient to successfully restart the data stream. Therefore, the program increments the value of p and checks (block 713) to see if it has completed the rescheduling for all of the periods. As mentioned above, the number of periods (i.e., distinct periods in the new schedule) will equal N−1 after the failure, but will be repeated.

If the program exits the 'no' leg of block 713, then it returns to repeat the assignment for the next period and continues to do so for N−1 periods. When the program has looped through block 712 N−1 times, then it updates with respect to the next adjacent disk (i.e., the disk next in higher order with respect to the disk involved in the rescheduling during the previous pass through block 12). Thus, the program loops through block 12 N−1 times during stage i to complete the rescheduling of the data streams provided by the failed disk for successive periods p.

After completing such loops, the program (block 714) updates the values of $m_t$ and $q_\tau$ to continue the rescheduling with the next disk vis-à-vis those streams of the batch being processed that were not rescheduled during current stage. The program (block 705) then increments t, and returns to block 704 if the current value of t is not greater than N. Otherwise, the program (block 707) increments k to the next stage and proceeds to block 3 to determine if one or more data streams had not been rescheduled during the previous stage. If so, then the program proceeds to block 703. Otherwise, the program (block 709) sets j to point to the next batch of data streams and then checks to see (block 710) if all batches have been rescheduled. If so, then the program exits. Otherwise, it returns to block 702.

The foregoing is merely illustrative of the principles of the invention. Those skilled in the art will be able to devise numerous arrangements, which, although not explicitly shown or described herein, nevertheless embody those principles that are within the spirit and scope of the invention. For example, the invention may be readily implemented in a local central office as well as a private branch exchange. It may also be implemented at the head end of a cable TV system. As a further example, although the invention has been discussed in terms of a video program and the data blocks forming the video program, it is clear that it may also be used in conjunction with other types of data.

The invention claimed is:

1. A method of storing data in a plurality of N independent disks comprising the steps of dividing the storage area of each of said disks into primary and secondary sections, partitioning said data into a plurality of successive blocks of data and storing said successive blocks of data in sequence in respective ones of the primary sections of said disks in a predetermined order, storing in sequence the blocks of data that have been stored in one of said primary sections of one of said disks in respective secondary sections of the other ones of said disks, unloading in sequence a block of data from the primary section of each of the N disks during respective Nth cycles and supplying the unloaded block of data to a particular one of a plurality of data streams being served by the N disks, where N>1, and responsive to one of the N disks failing, re-assigning the data streams scheduled to be supplied by the failed one of said disks for a respective one of the cycles to respective ones of the remaining disks containing a restart data block for a respective one of such data streams, in which said re-assigning is constrained so that no more than n/N additional streams are assigned to any one of the remaining disks, where n is the maximum number of data streams that can be served concurrently by any one of the disks in one cycle.

2. The method of claim 1 further comprising the step of, responsive to not being able to reassign a particular one of the data streams to the disk containing the restart data block for a current cycle, then reassigning that data stream to the preceding disk in the sequence.

* * * * *